(12) United States Patent
Seto et al.

(10) Patent No.: US 7,585,567 B2
(45) Date of Patent: Sep. 8, 2009

(54) TRANSPARENT CONDUCTIVE SUBSTRATE, METHOD OF MANUFACTURING THE SAME, AND PHOTOELECTRIC CONVERSION ELEMENT

(75) Inventors: Yasunori Seto, Minato-Ku (JP); Akira Fujisawa, Minato-Ku (JP); Yukio Sueyoshi, Minato-Ku (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 187 days.

(21) Appl. No.: 10/555,939

(22) PCT Filed: Jun. 16, 2004

(86) PCT No.: PCT/JP2004/008446

§ 371 (c)(1),
(2), (4) Date: Nov. 8, 2005

(87) PCT Pub. No.: WO2004/112057

PCT Pub. Date: Dec. 23, 2004

(65) Prior Publication Data

US 2006/0261447 A1 Nov. 23, 2006

(30) Foreign Application Priority Data

Jun. 17, 2003 (JP) ............................. 2003-172441

(51) Int. Cl.
*B32B 15/00* (2006.01)
*H01L 31/04* (2006.01)

(52) U.S. Cl. ..................... 428/432; 428/212; 428/699; 428/701; 428/702; 136/256

(58) Field of Classification Search ....................... None
See application file for complete search history.

(56) References Cited

U.S. PATENT DOCUMENTS

| 4,853,257 | A | 8/1989 | Henery | |
|---|---|---|---|---|
| 6,218,018 | B1 * | 4/2001 | McKown et al. | 428/432 |
| 6,362,414 | B1 * | 3/2002 | Fujisawa et al. | 136/256 |
| 6,380,480 | B1 * | 4/2002 | Norimatsu et al. | 136/256 |

FOREIGN PATENT DOCUMENTS

| EP | 0 755 902 | 1/1997 |
|---|---|---|
| EP | 1 057 796 | 12/2000 |
| JP | 62-211966 | 9/1987 |
| JP | 62-213281 | 9/1987 |
| JP | 63-275187 | 1/1988 |
| JP | 1-96044 | 4/1989 |
| JP | 8-15712 | 1/1996 |
| JP | 9-40442 | 2/1997 |
| JP | 2003-151355 | 5/2003 |

* cited by examiner

*Primary Examiner*—Ling Xu
(74) *Attorney, Agent, or Firm*—Hamre, Schumann, Mueller & Larson, P.C.

(57) ABSTRACT

The present invention provides a transparent conductive substrate having optical transparency and conductivity that have been improved in a well-balanced manner. The transparent conductive substrate of the present invention includes a transparent base and a conductive metal oxide film formed on the base. This metal oxide film contains tin and fluorine. In a profile of the metal oxide film determined in the depth direction by SIMS, the value obtained by subtracting the minimum Imin of the ratio of sensitivity of the fluorine to that of the tin from the maximum Imax thereof is at least 0.15. The maximum Imax is higher than 1 while the minimum Imin is lower than 1. Furthermore, the position where the maximum Imax is obtained is closer to the surface of the metal oxide film as compared to the position where the minimum Imin is obtained.

6 Claims, 6 Drawing Sheets

TRANSPARENT CONDUCTIVE SUBSTRATE, METHOD OF MANUFACTURING THE SAME, AND PHOTOELECTRIC CONVERSION ELEMENT

TECHNICAL FIELD

The present invention relates to a transparent conductive substrate including a transparent base and a metal oxide film formed thereon, and a photoelectric conversion element including the substrate.

BACKGROUND ART

Transparent conductive substrates that each include a transparent base, such as glass, and a conductive metal oxide film formed thereon are used for various devices, with a functional thin film being formed on the metal oxide film. Examples of such devices include: photoelectric conversion elements such as optical sensors, solar cells, etc.; image displays such as liquid crystal displays, organic electroluminescence (EL) displays, plasma displays, field emission displays (FEDs), etc.; and light emitting devices such as light emitting diodes, solid state lasers, etc. The transparent conductive substrates may be used also as Low-E (Low-Emissivity) glass, electromagnetic wave shielding glass, defogging glass, etc. for windows of buildings or vehicles, doors of refrigerators for stores, etc. The transparent conductive substrates are useful also as the document glasses of copying machines.

A photoelectric conversion element converts optical energy into electric energy or vice versa. For example, a silicon-thin-film solar cell has a configuration in which a silicon film with a photoelectric conversion function and an electrode film (a back electrode film) are formed sequentially on a metal oxide film of a transparent conductive substrate. The silicon-thin-film solar cell converts solar energy into electric energy. The losses caused by the reflection and absorption of light by a transparent conductive substrate as well as the electrical resistance of a metal oxide film decrease the efficiency of conversion of solar energy into electric energy.

For the respective uses that are typified by the photoelectric conversion element, the transparent conductive substrate is required to have both high optical transparency and high conductivity. It is easy to improve each of the optical transparency and the conductivity independently but it is not easy to improve both of them in a well-balanced manner.

It has been well-known to add a suitable dopant, for instance, fluorine, to a metal oxide film, for example, a tin oxide film, to lower the electrical resistance. The dopant improves the conductivity of the metal oxide film but deteriorates the optical transparency of the metal oxide film.

The conventional proposals about improvements in properties of the tin oxide film are described in JP62(1987)-211966A, JP62(1987)-213281A, JP1(1989)-96044A, and JP9(1997)-40442A, for example. The improvements achieved conventionally, however, were insufficient in terms of improving both the optical transparency and the conductivity in a well-balanced manner.

DISCLOSURE OF THE INVENTION

The present invention is intended to provide a transparent conductive substrate having optical transparency and conductivity that have been improved in a well-balanced manner.

According to the studies made by the inventors, when fluorine is allowed to concentrate to be present in the vicinity of a film surface to the extent that the content thereof is far beyond the suitable range derived from conventional technical common knowledge, the fluorine contained in the film improves the conductivity sufficiently without considerably deteriorating the optical transparency of the film. In order to obtain this effect, fluorine should be added to the extent of providing a range in which the sensitivity (specifically, a value expressed with a unit of log (count/second) that is obtained through the measurement carried out by a secondary ion mass spectroscopy (hereinafter referred to as "SIMS")) of fluorine (F) is higher than the sensitivity of tin (Sn) in the profile obtained in the depth direction by the SIMS. A high concentration of fluorine added to such an extent departs from the range of the suitable amount thereof to be added as a "dopant" that has been known conventionally. However, a very high concentration of fluorine that is present in the vicinity of the film surface contributes to the improvement in mobility of charge carriers in the film. In this metal oxide film, when a layer with a lower fluorine concentration is provided on the substrate side of the layer containing a very high concentration of fluorine, it is possible to obtain both high optical transparency and high conductivity.

That is, the transparent conductive substrate of the present invention includes a transparent base and a conductive metal oxide film formed on the base. The transparent conductive substrate is characterized in that: the metal oxide film contains tin and fluorine; in the profile of the metal oxide film determined in the depth direction by the SIMS, the value obtained by subtracting the minimum Imin of the ratio of the sensitivity of the fluorine to that of the tin from the maximum Imax thereof is at least 0.15; the maximum Imax is higher than 1; the minimum Imin is lower than 1; and the position where the maximum Imax is obtained is closer to the surface (the opposite surface to the base) of the metal oxide film as compared to the position where the minimum Imin is obtained. Furthermore, the present invention provides a photoelectric conversion element that includes the above-mentioned transparent conductive substrate.

According to the present invention, since the mobility of carriers contained in the metal oxide film increases, an improvement in the conductivity of the film can be achieved without causing an increase in carrier concentration that increases optical absorptivity. Accordingly, it is possible to provide a transparent conductive substrate having optical transparency and conductivity that have been improved in a well-balanced manner.

BEST MODE FOR CARRYING OUT THE INVENTION

Figure 1:
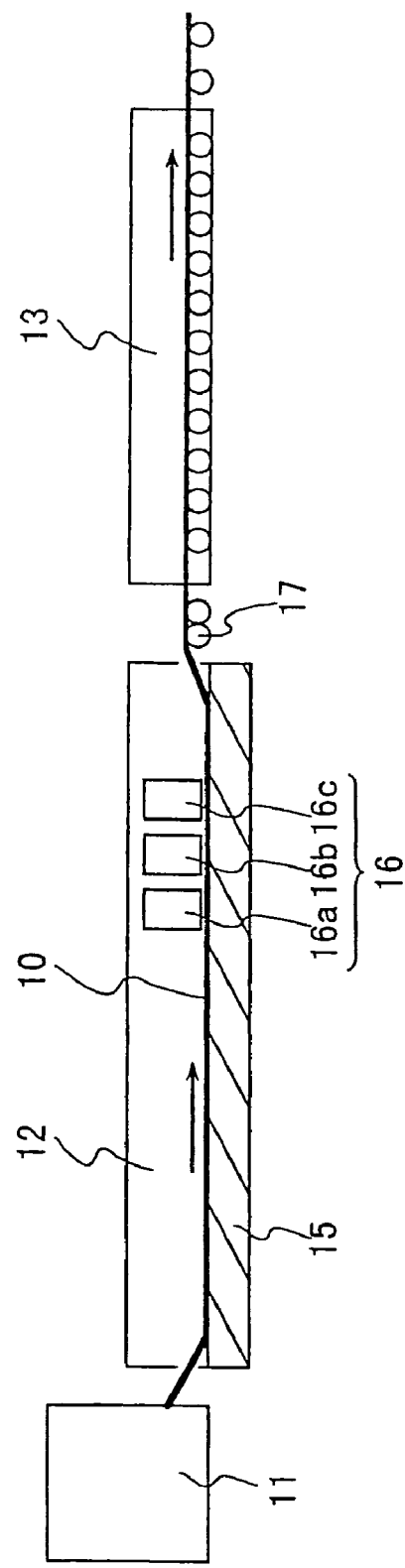
FIG. 1 is a diagram showing an example of the configuration of the apparatus used for manufacturing the conductive substrate of the present invention.

In the metal oxide film included in the transparent conductive substrate of the present invention, fluorine is distributed considerably unevenly in the direction of the film thickness to the extent that the fluorine content by percentage is abnormally high in a part of the metal oxide film. Specifically, the maximum sensitivity ratio Imax in the profile obtained in the depth direction by the SIMS is high to the extent of being higher than 1, preferably at least 1.1, and more preferably at least 1.2, where I denotes the ratio of the sensitivity of fluorine to that of tin in the profile. On the other hand, the minimum sensitivity ratio Imin is lower than 1, preferably 0.95 or lower. The difference between the Imax and the Imin is at least 0.15, preferably at least 0.2.

Experiments carried out by the inventors made it clear that the mobility of carriers contained in the film improved when fluorine was distributed unevenly to the above-mentioned extent. The details of the reason for it are not sufficiently clear. However, if an attempt to give a conjecture is to be made, it is conceivable that grain boundary defects of metal oxide crystals are terminated with fluorine and thereby the scattering degree of carriers decreases, which contributes to the improvement of the mobility of carriers contained in a region with a high fluorine concentration. On the other hand, excellent optical transparency is obtained from a region of the film containing a smaller amount of fluorine. When these regions are combined together, a film can be obtained that has both high optical transparency and high conductivity.

As described later (see Comparative Example 2), even when the fluorine concentration distribution is uneven to the extent that the difference between the Imax and the Imin is at least 0.15, the mobility of carriers hardly varies unless the Imax is higher than 1. The mobility of carriers can be improved remarkably when fluorine whose concentration is high enough that the concentration is hard to consider as that of a dopant is added locally.

Generally, the optical absorptivity and conductivity of a conductive film can be expressed by:

$$\alpha = \beta \times n; \text{ and} \qquad \text{Formula 1}$$

$$\rho = 1/(e \times n \times \mu). \qquad \text{Formula 2}$$

In the above formulae, $\alpha$ denotes an optical-absorption coefficient, $\beta$ indicates a constant, n denotes a carrier concentration, $\rho$ indicates specific resistance, e denotes a constant, and $\mu$ indicates mobility.

The variables included in Formulae 1 and 2 are the carrier concentration and mobility only. If the carrier concentration n decreases, the optical-absorption coefficient $\alpha$ decreases and thereby the optical transparency improves, but at the same time, the specific resistance $\rho$ increases and thereby the conductivity deteriorates. However, if the mobility $\mu$ increases, the specific resistance $\rho$ decreases and thereby the conductivity improves while the optical transparency is maintained since the optical-absorption coefficient $\alpha$ does not vary. Accordingly, the improvement of the mobility $\mu$ makes it possible to improve the optical transparency and conductivity of the transparent conductive substrate in a well-balanced manner.

In the present invention, an adjustment is made so that the position where the Imax is obtained is closer to the film surface as compared to the position where the Imin is obtained in the profile obtained in the depth direction by the SIMS measurement. When the position where the Imax is obtained is further closer to the surface, the conductivity of the metal oxide film can be improved further.

Preferably, the metal oxide film is, for instance, a film containing at least one selected from indium oxide, titanium oxide, silicon oxide, and tin oxide, particularly a film containing tin oxide as its main component. In this specification, the "main component" denotes a component that accounts for at least 50 wt % of the whole as is used commonly. A film containing tin oxide as its main component is doped at least with fluorine so that the fluorine is distributed as described above, and thereby the conductivity thereof is improved.

The thickness of the metal oxide film may be adjusted suitably according to the characteristics to be required for the transparent conductive substrate. However, in order to prevent the film from exfoliating, the thickness is preferably 1 $\mu$m or less, more preferably in the range of 100 nm to 1000 nm.

The characteristics of the metal oxide film may be adjusted according to the use of the transparent conductive substrate. When the transparent conductive substrate is used for a photoelectric conversion element, a preferable specific resistance of the metal oxide film is in the range of $1 \times 10^{-4}$ $\Omega \cdot$cm to $15 \times 10^{-4}$ $\Omega \cdot$cm. Furthermore, it is preferable that the average of optical-absorption coefficients of the metal oxide film that are obtained at a wavelength in the range of 600 nm to 900 nm be 500 cm$^{-1}$ or lower. When the present invention is applied, both the characteristics that are required to such an extent as described above can be obtained easily.

Preferably, the metal oxide film containing fluorine whose content by percentage is uneven to such an extent as described above is obtained by stacking at least two layers that are different in fluorine content by percentage from each other. It also is possible to use one layer in which the fluorine may be distributed so that its content by percentage is uneven. However, in order to obtain desired distribution stably, it is better to stack layers that are different in fluorine content by percentage from each other.

The method of forming the metal oxide film is not particularly limited. It, however, is preferable that the metal oxide film be formed by a method involving a pyrolytic oxidation reaction of raw materials, for instance, a spray method or a chemical vapor deposition (CVD) method. Examples of the spray method include a solution spray method, a dispersion spray method, and a powder spray method. In the spray method, however, since it is difficult to control the size of droplets, the spray amount, and the displacement volume, a high quality metal oxide film is hard to form. Thus the CVD method is suitable as the method of forming the metal oxide film.

Examples of the raw material to be used for obtaining tin oxide through the pyrolytic oxidation reaction include tin tetrachloride, dimethyltin dichloride, dibutyltin dichloride, tetramethyltin, tetrabutyltin, dioctyltin dichloride, monobutyltin trichloride, and dibutyltin diacetate. Examples of the raw material to be used for obtaining titanium oxide include titanium tetrachloride and titanium isopropoxide.

Furthermore, an oxidizer is added to a gaseous material that is used in the CVD method. Examples of the oxidizer to be used herein include, for instance, oxygen, water, water vapor, and dry air. Preferably, water vapor is contained as the oxidizer.

In order to add fluorine, a fluorine-containing compound also should be added. Examples of the fluorine-containing compound include hydrogen fluoride, trifluoroacetic acid, bromotrifluoromethane, and dichlorodifluoromethane. Even when the amount of a fluorine-containing compound to be added is constant, the amount of fluorine to be contained in the film may vary according to the type of the fluorine-containing compound, the film-forming temperature and apparatus to be employed, the ratio of water to a tin compound, etc. Accordingly, it is preferable that the film formation conditions that allow, for example, the Imax exceeding 1 to be obtained be predetermined by preliminary examinations. A preferable fluorine compound is a hydrogen fluoride.

The pyrolytic oxidation reaction progresses on the base that has been heated to a high temperature. A preferable temperature of the base surface is 400° C. to 800° C. When the temperature of the base surface is at least 600° C., the metal oxide thin film is crystallized easily to allow high conductivity to be obtained readily and the film growth rate also increases.

A method of forming a metal oxide film on a glass ribbon with a temperature of at least 600° C. that is located on a molten tin bath (hereinafter referred to as an "on-line CVD method") in a process of manufacturing a glass sheet by the float glass process makes it unnecessary to heat the base and allows a high quality metal oxide film to be formed on a base with a larger area.

A preferable gaseous material to be used for forming an oxide film doped with fluorine by the CVD method includes tin tetrachloride, water vapor, and hydrogen fluoride. The film formation that is carried out using this gaseous material has a problem in that the tin tetrachloride is oxidized by the water vapor and thereby solid tin oxide is produced in the gaseous material before the gaseous material reaches the base surface. Since the accumulation of the solid tin oxide causes a pipe to be blocked, this reaction brings about a big problem in mass-production equipment in which the on-line CVD method is employed.

Since hydrogen chloride prevents tin tetrachloride from being oxidized, it is advantageous that hydrogen chloride further is added to the gaseous material to be used in the CVD method. Preferably, the hydrogen chloride is mixed with at least one of the tin tetrachloride and water vapor that have not been mixed together yet. The mixture ratio of the hydrogen chloride to the tin tetrachloride is preferably lower than 1, more preferably lower than 0.2, in terms of the mole ratio.

The metal oxide film may be formed directly on the base but may be formed on the surface of an undercoating film formed on the base. The undercoating film interposed between the base and the metal oxide film makes it possible to make efficient use of advantageous properties of the base and the metal oxide film and to alleviate disadvantageous properties thereof or disadvantageous characteristics resulted from the combination thereof. When a glass sheet containing an alkaline component is used for the base, it is preferable that an undercoating film be formed to prevent the alkaline component from diffusing. This undercoating film may be referred to as a "barrier film". A silicon oxide film is suitable as the barrier film.

The undercoating film may be formed of two layers or more according to the intended use thereof. Preferable examples of the undercoating film formed of two layers or more include an undercoating film composed of a first undercoating layer made of crystalline oxide and a second undercoating layer that serves as a barrier to alkaline components, with the first undercoating layer and the second undercoating layer being formed sequentially from the substrate side. Preferably, the first undercoating layer is a tin oxide film while the second undercoating layer is a silicon oxide film. Preferable thicknesses of the first and second undercoating layers are in the range of 10 nm to 100 nm and in the range of 10 nm to 50 nm, respectively.

The type of the base is not particularly limited but generally a glass sheet is preferable.

FIG. 1 shows the configuration of an apparatus that is used in the on-line CVD method. A molten glass material is poured from a melting furnace (a float furnace) 11 into a float bath 12 to be formed into a glass ribbon 10 while moving on a molten tin bath 15. Thereafter, this is lifted with a roller 17 and then is carried into an annealing furnace 13. The glass ribbon solidified in the annealing furnace 13 is cut into a glass sheet with a predetermined size using a cutting device, which is not shown in the figure. The float bath 12 includes a predetermined number of coaters 16 (three coaters 16a, 16b, and 16c in the embodiment shown in the figure) that are disposed at a predetermined distance from the surface of the glass ribbon 10. These coaters supply gaseous materials and thereby, for instance, an undercoating film and a metal oxide film are formed sequentially on the glass ribbon 10. The number of coaters may be increased according to the number of layers to be formed and the thicknesses of films to be formed. Moreover, an additional thin film may be formed on the glass ribbon 10 carried out of the float bath 12 by a spray method, for instance.

Figure 2:
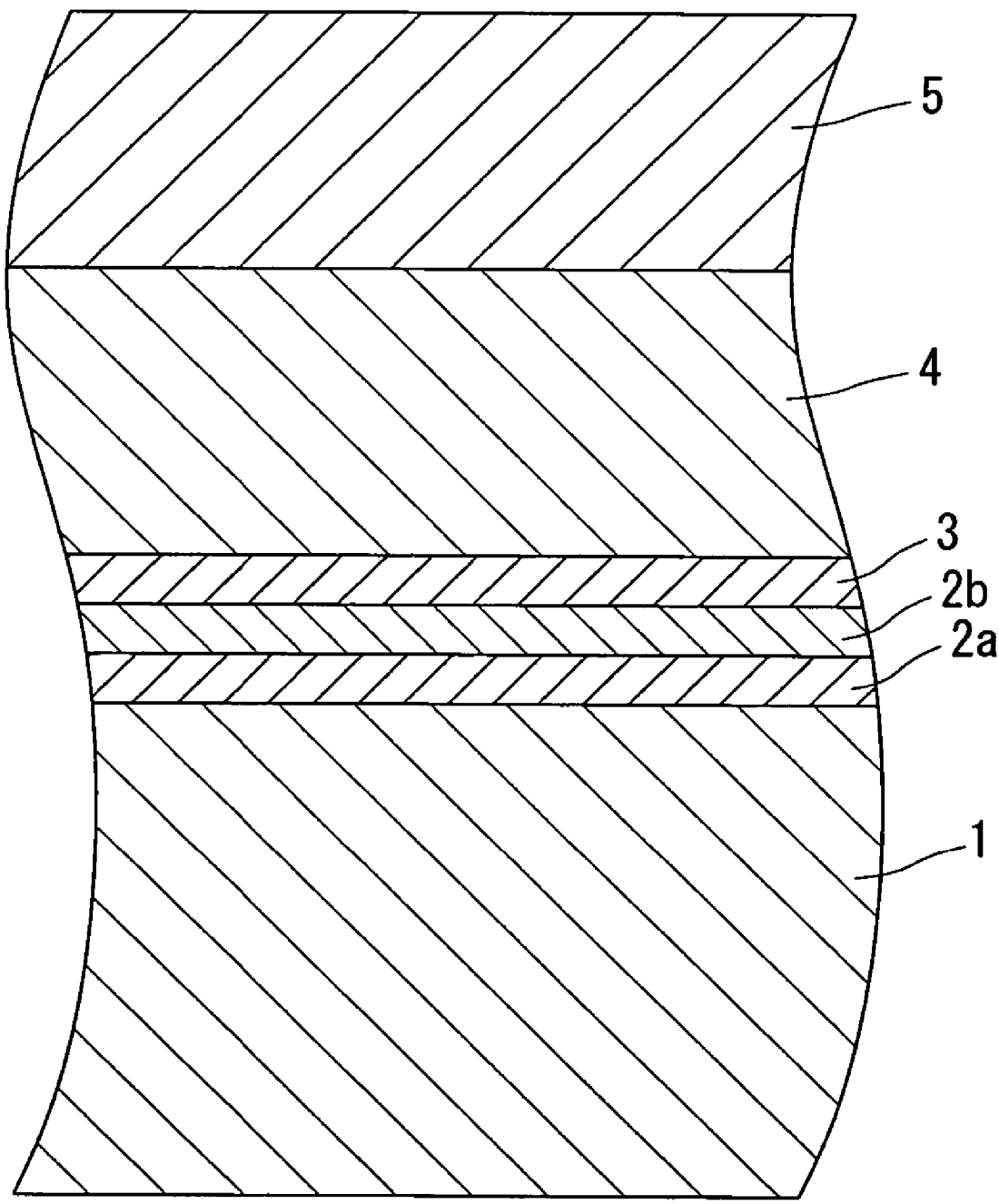
FIG. 2 is a cross-sectional view showing an example of the conductive substrate of the present invention.

FIG. 2 shows an embodiment of the transparent conductive substrate according to the present invention. In this transparent conductive substrate, a first undercoating layer 2a and a second undercoating layer 2b are formed sequentially on a base 1 while a metal oxide film composed of a buffer layer 3, a first conductive layer 4, and a second conductive layer 5 is formed on the second undercoating layer 2b. The buffer layer 3 includes a lot of points where crystals start growing and serves to facilitate growth of the metal oxide film. Preferably, the buffer layer 3 is formed at a relatively lower film growth rate than those at which the conductive layers 4 and 5 are formed.

Figure 3:
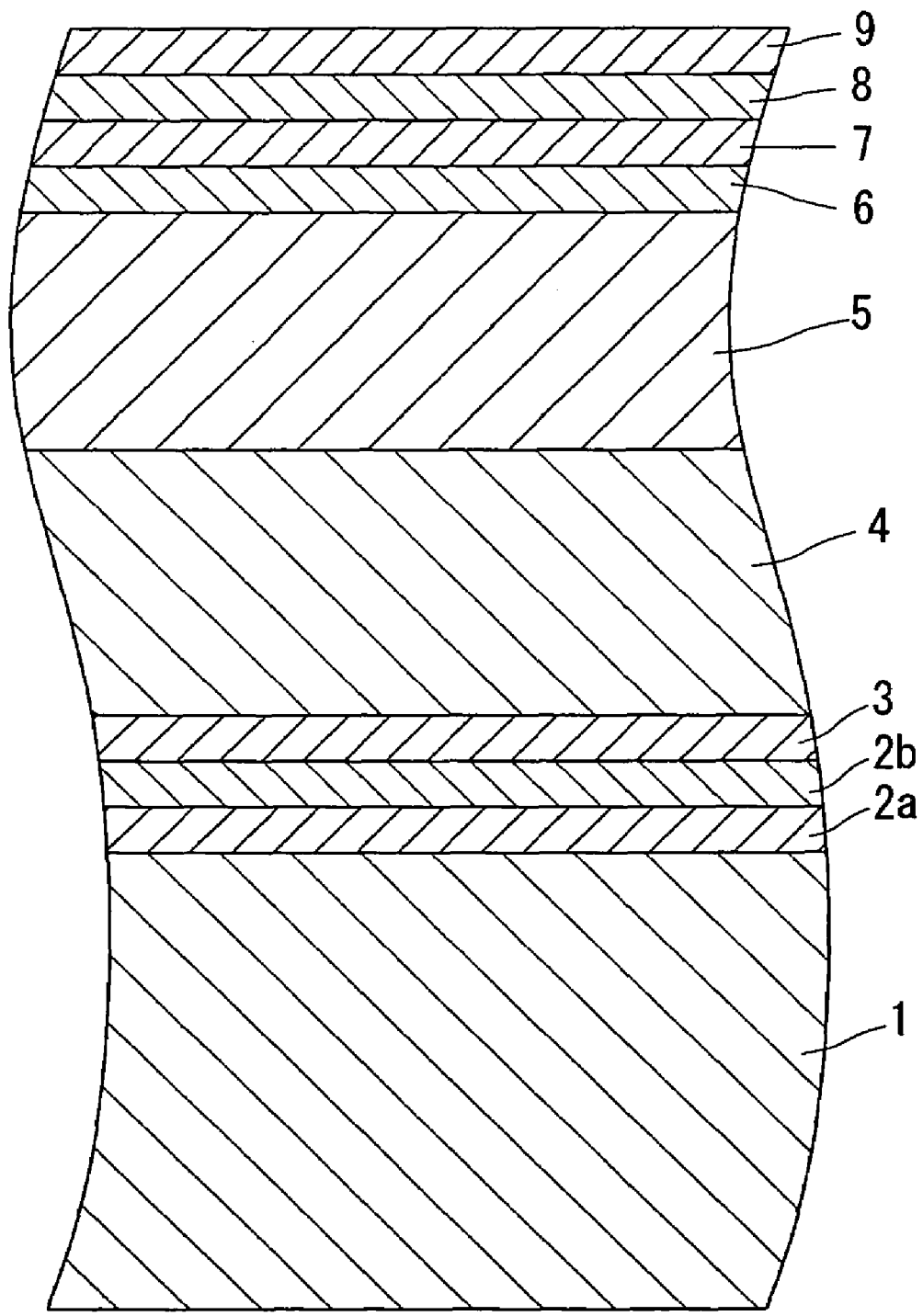
FIG. 3 is a cross-sectional view showing an example of the photoelectric conversion element of the present invention.

FIG. 3 shows an embodiment of the photoelectric conversion element including the transparent conductive substrate shown in FIG. 2. In this photoelectric conversion element, photoelectric conversion layers 6 to 8 and a back electrode layer (a back plate film) 9 are formed sequentially on the second conductive layer 5. The photoelectric conversion layers are formed of photoreactive semiconductor thin layers. The photoelectric conversion layers to be used in general are amorphous-silicon-based semiconductor thin films, non-single-crystal-silicon-based crystalline semiconductor thin films, or combinations thereof. With respect to the photoelectric conversion layers, it is preferable that, for instance, a p-type silicon semiconductor layer 6, an i-type silicon semiconductor layer 7, and an n-type silicon semiconductor layer 8 be stacked in this order. Generally, a metal thin film is used as the back electrode layer 9. Additionally, a metal oxide thin film may be disposed between the photoelectric conversion layer 8 and the back electrode layer 9 so as to stabilize the back electrode layer 9.

EXAMPLE

Hereafter, the present invention is described using examples but is not limited by the following examples.

SIMS Measurement

Distributions (depth profile) of elements such as tin, fluorine, etc. contained in a metal oxide film were determined using SIMS "PHI6600" manufactured by ULVAC-PHI, INC. Sputtering for forming the metal oxide film was carried out in an oxygen atmosphere with a pressure of $2.0 \times 10^{-7}$ Pa under conditions including a sputtering voltage of 4 kV, a sputtering current of 150 nA, and a sputtering region of 300 µm□×0.7 (63000 µm$^2$). From the depth profile thus obtained, the ratio Ix (Ix=Fx/Snx) of fluorine sensitivity (Fx) to tin sensitivity (Snx) at a depth x was determined. In addition, the maximum Imax and the minimum Imin of the ratio Ix in the metal oxide film were determined. The boundary of the metal oxide film on the base side was determined according to the position where the sensitivity of silicon (Si) that was present in the undercoating film started increasing.

Comparative Example 1

An undercoating film and a metal oxide film were formed on a glass ribbon in this order by the on-line CVD method that employed the same apparatus as that shown in FIG. 1. In this case, 98 vol. % of nitrogen and 2 vol. % of hydrogen were supplied into the float bath while the inside of the float bath was maintained at a slightly higher pressure than that of the outside thereof. Thereby the inside thereof was kept in a nonoxidative atmosphere.

A gaseous material consisting of tin tetrachloride (vapor), water vapor, hydrogen chloride, nitrogen, and helium was supplied from the first coater located on the furthest upstream side. Thereby a 55-nm thick tin oxide film (a first undercoating layer) was formed on the glass ribbon. A gaseous material consisting of monosilane, ethylene, oxygen, and nitrogen was supplied from the second coater and thereby a 30-nm thick silicon oxide film (a second undercoating layer) was formed on the tin oxide film.

Subsequently, a gaseous material consisting of 0.53 mol % of tin tetrachloride (vapor), 42.4 mol % of water vapor, 0.06 mol % of hydrogen chloride, and nitrogen (the rest) was supplied from the third coater. Thus a 90-nm thick tin oxide film (a buffer layer) was formed on the second undercoating layer. A gaseous material consisting of 3.5 mol % of tin tetrachloride (vapor), 35.2 mol % of water vapor, 0.05 mol % of hydrogen fluoride, 0.17 mol % of hydrogen chloride, and nitrogen (the rest) was supplied from the fourth coater. Thereby a tin oxide film doped with fluorine (a $SnO_2$:F layer; a first conductive layer) was formed on the buffer layer. A gaseous material consisting of 2.6 mol % of tin tetrachloride (vapor), 39.6 mol % of water vapor, 0.15 mol % of hydrogen fluoride, 0.13 mol % of hydrogen chloride, and nitrogen (the rest) was supplied from the fifth coater. Thereby a tin oxide film doped with fluorine (a $SnO_2$:F layer; a second conductive layer) was formed on the first conductive film. The thickness of the tin oxide films doped with fluorine (the $SnO_2$:F film), i.e. the total thickness of the first and second conductive layers was about 850 nm.

In the transparent conductive substrate thus obtained, the average of optical-absorption coefficients of the tin oxide films obtained at a wavelength of 600 nm to 900 nm was 374 cm$^{-1}$ and the specific resistance was $11.8 \times 10^{-4}$ Ω·cm.

Figure 4:
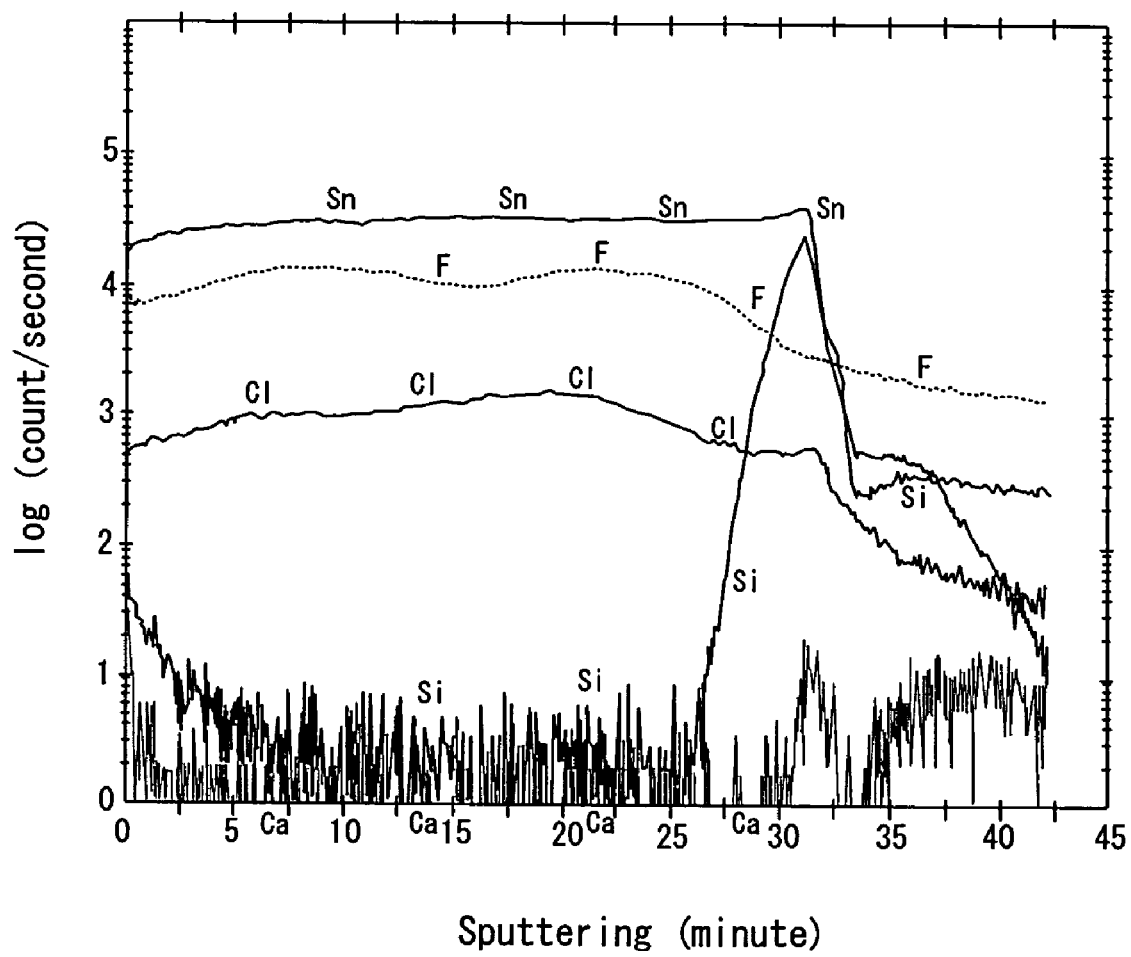
FIG. 4 is a profile of the conductive substrate according to Comparative Example 1, which was obtained in the depth direction by the SIMS measurement.

FIG. 4 shows the results of the SIMS measurement with respect to the transparent conductive substrate according to Comparative Example 1. In this case, Imax=0.99, Imin=0.90, and the difference therebetween was 0.09.

Comparative Example 2

A transparent conductive substrate was obtained in the same manner as in Comparative Example 1 except that a gaseous material consisting of 3.9 mol % of tin tetrachloride (vapor), 39.1 mol % of water vapor, 0.21 mol % of hydrogen chloride, and nitrogen (the rest) was supplied from the fourth coater while a gaseous material consisting of 3.4 mol % of tin tetrachloride (vapor), 50.7 mol % of water vapor, 0.59 mol % of hydrogen fluoride, and nitrogen (the rest) was supplied from the fifth coater. The total thickness of the tin oxide film doped with fluorine (the $SnO_2$:F film) was about 887 nm.

In the transparent conductive substrate thus obtained, the average of optical-absorption coefficients of the tin oxide films obtained at a wavelength of 600 nm to 900 nm was 326 cm$^{-1}$ and the specific resistance was $10.5 \times 10^{-4}$ Ω·cm.

Figure 5:
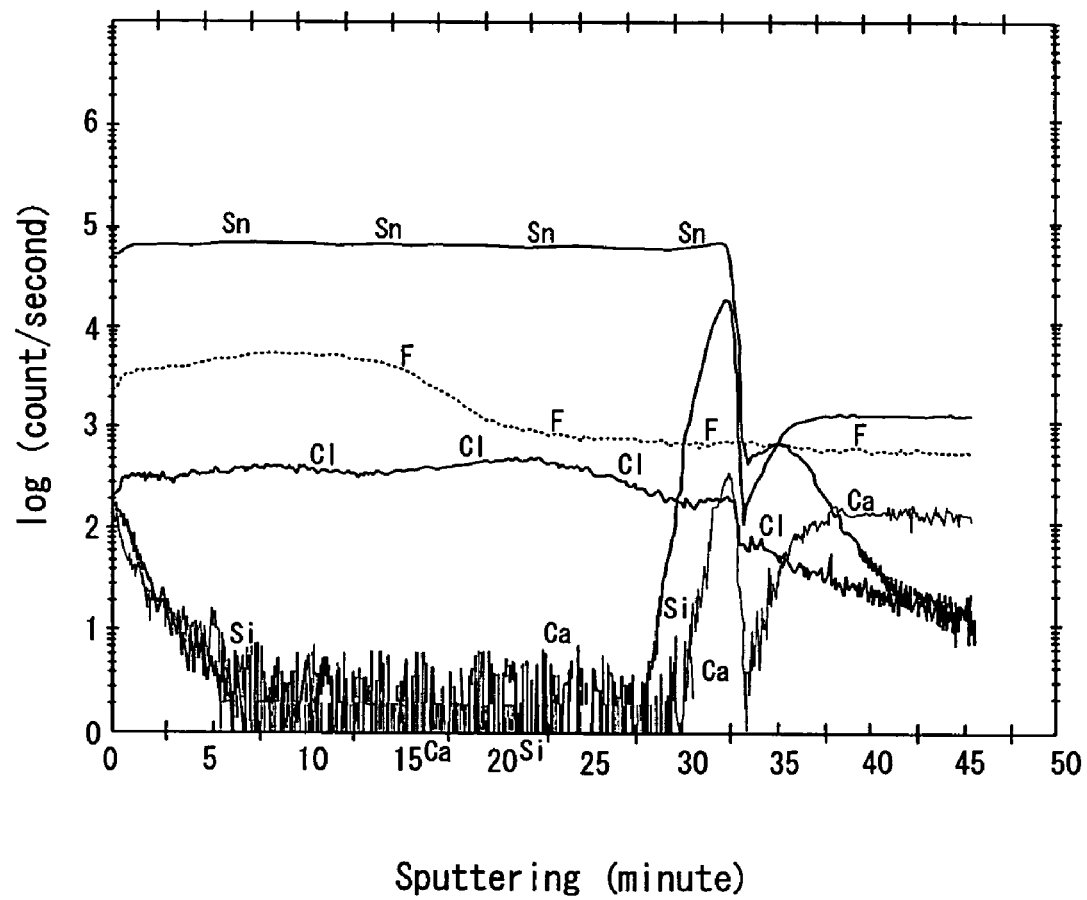
FIG. 5 is a profile of the conductive substrate according to Comparative Example 2, which was obtained in the depth direction by the SIMS measurement.

FIG. 5 shows the results of the SIMS measurement with respect to the transparent conductive substrate according to Comparative Example 2. In this case, Imax=0.76, Imin=0.58, and the difference therebetween was 0.18.

The carrier concentration was measured and then the mobility was calculated. As a result, the carrier concentration and the carrier mobility of the transparent conductive substrate of Comparative Example 2 were 1.13 times and 1.09 times as high as those of the transparent conductive substrate of Comparative Example 1, respectively.

Example 1

A transparent conductive substrate was obtained in the same manner as in Comparative Example 1 except that a gaseous material consisting of 3.2 mol % of tin tetrachloride (vapor), 31.9 mol % of water vapor, 0.17 mol % of hydrogen chloride, and nitrogen (the rest) was supplied from the fourth coater while a gaseous material consisting of 3.4 mol % of tin tetrachloride (vapor), 50.36 mol % of water vapor, 1.17 mol % of hydrogen fluoride, and nitrogen (the rest) was supplied from the fifth coater. The total thickness of the tin oxide film doped with fluorine (the $SnO_2$:F film) was about 960 nm.

In the transparent conductive substrate thus obtained, the average of optical-absorption coefficients of the tin oxide films obtained at a wavelength of 600 nm to 900 nm was 349 cm$^{-1}$ and the specific resistance was $8.6 \times 10^{-4}$ Ω·cm.

Figure 6:
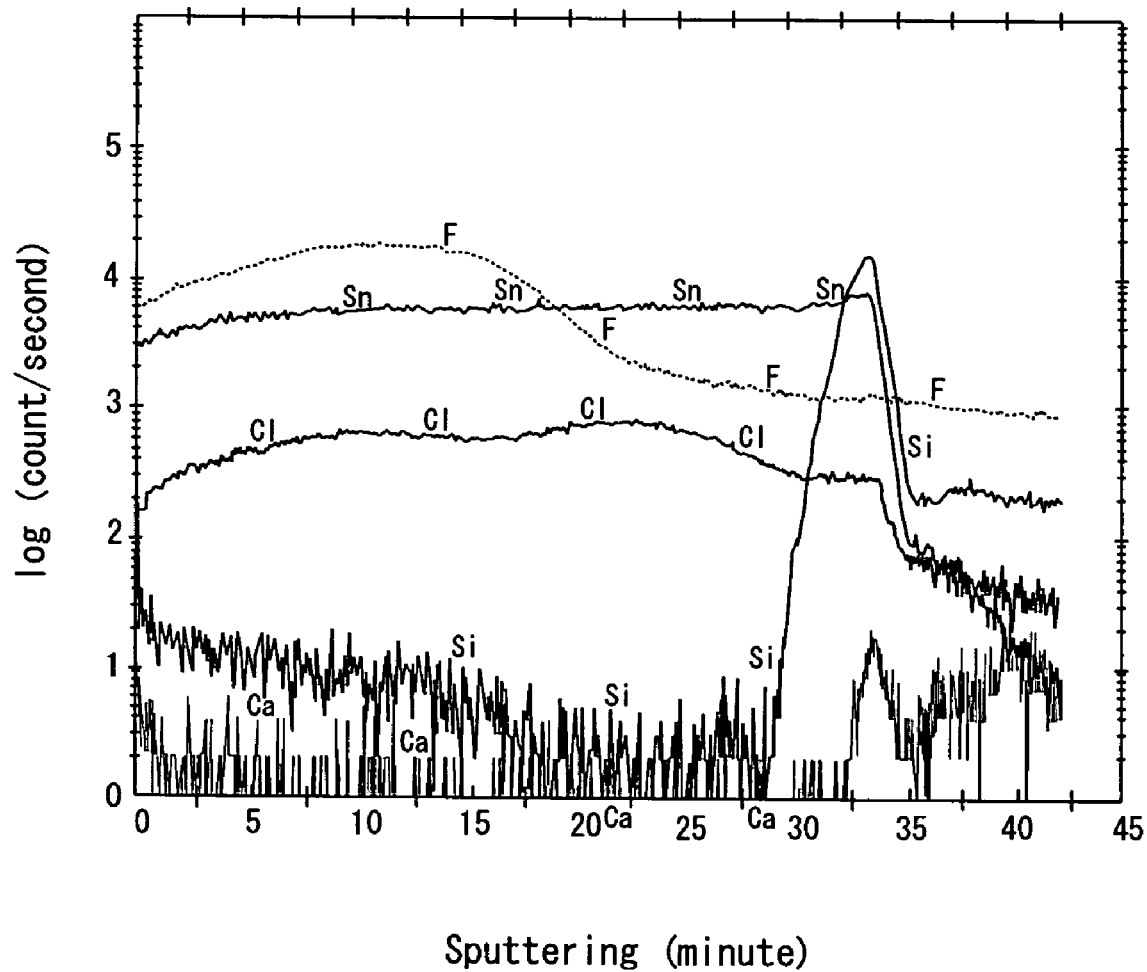
FIG. 6 is a profile of the conductive substrate according to Example 1, which was obtained in the depth direction by the SIMS measurement.

FIG. 6 shows the results of the SIMS measurement with respect to the transparent conductive substrate according to Example 1. In this case, Imax=1.21, Imin=0.91, and the difference therebetween was 0.30. The position where the Imax was obtained was in a shallower position (i.e. closer to the film surface) as compared to the position where the Imin was obtained. The sensitivity of fluorine decreases monotonically from the position where the Imax was obtained to the position where the Imin was obtained. The sensitivities of the elements including fluorine decrease in the region located very close to the film surface. This is because of the effects of irregularities that are present at the surface of the metal oxide.

The carrier concentration and the carrier mobility of this transparent conductive substrate were 1.04 times and 1.34 times as high as those of the transparent conductive substrate of Comparative Example 1, respectively.

The above-mentioned results were summarized and indicated in Tables 1 and 2.

In Comparative Example 2, fluorine contained in the film was concentrated in the vicinity of the surface (FIG. 5) but the mobility hardly was improved due to the fluorine concentration that was not high (Imax<1) in the vicinity of the surface. On the other hand, in Example 1, since the fluorine concentration was increased considerably in the vicinity of the surface (Imax>1), the mobility improved greatly. The transparent conductive substrate of Example 1 has both a specific resistance of $10 \times 10^{-4}$ Ω·cm or lower and an optical-absorption coefficient of 350 cm$^{-1}$ or lower.

TABLE 1

|  | Imax | Imin | Imax − Imin |
|---|---|---|---|
| Comparative Example 1 | 0.99 | 0.90 | 0.09 |
| Comparative Example 2 | 0.76 | 0.58 | 0.18 |
| Example 1 | 1.21 | 0.91 | 0.30 |

TABLE 2

|  | Specific Resistance | Optical-Absorption Coefficient | Relative Carrier Concentration | Relative Mobility |
|---|---|---|---|---|
| Comparative Example 1 | 11.8 | 374 | 1.00 | 1.00 |
| Comparative Example 2 | 10.5 | 326 | 1.13 | 1.09 |
| Example 1 | 8.6 | 349 | 1.04 | 1.34 |

\* Specific Resistance: ×10$^{-4}$ Ω · cm
\* Optical-Absorption Coefficient: cm$^{-1}$ (600 nm to 900 nm; the average)

INDUSTRIAL APPLICABILITY

As described above, the present invention provides a transparent conductive substrate having optical transparency and conductivity that have been improved in a well-balanced manner. Accordingly, the present invention is highly useful in the fields such as those of the various devices exemplified above, window glass, etc., particularly in the field of photoelectric conversion elements.

The invention claimed is:

1. A transparent conductive substrate comprising a transparent base and a conductive metal oxide film formed on the base,
wherein the metal oxide film consists essentially of tin oxide and fluorine; in a profile of the metal oxide film determined in a depth direction by SIMS, a value, which shows degree of distribution of fluorine contained in the metal oxide film, obtained by subtracting the minimum Imin of a ratio of sensitivity of the fluorine to that of the tin from the maximum Imax thereof is at least 0.15; the maximum Imax is higher than 1; the minimum Imin is lower than 1; and a position where the maximum Imax is obtained is closer to a surface of the metal oxide film as compared to a position where the minimum Imin is obtained, and
the metal oxide film has a thickness of 1 μm or less.

2. The transparent conductive substrate according to claim 1, wherein an average of optical-absorption coefficients of the metal oxide film obtained at a wavelength in a range of 600 nm to 900 nm is 500 cm$^{-1}$ or lower.

3. The transparent conductive substrate according to claim 1, further comprising an undercoating film between the base and the metal oxide film.

4. The transparent conductive substrate according to claim 1, wherein the metal oxide film comprises tin oxide as its main component.

5. The transparent conductive substrate according to claim 1, wherein the base is a glass sheet.

6. A photoelectric conversion element comprising a transparent conductive substrate according to claim 1.

* * * * *